(12) United States Patent
Fermon et al.

(10) Patent No.: US 12,274,177 B2
(45) Date of Patent: Apr. 8, 2025

(54) MAGNETORESISTIVE STACK WITHOUT RADIATED FIELD, SENSOR AND MAGNETIC MAPPING SYSTEM COMPRISING SUCH A STACK

(71) Applicant: COMMISSARIAT À L'ENERGIE ATOMIQUE ET AUX ÉNERGIES ALTERNATIVES, Paris (FR)

(72) Inventors: Claude Fermon, Gif sur Yvette (FR); Aurélie Solignac, Gif sur Yvette (FR); Myriam Pannetier-Lecoeur, Gif sur Yvette (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 429 days.

(21) Appl. No.: 17/762,233

(22) PCT Filed: Sep. 16, 2020

(86) PCT No.: PCT/EP2020/075896
§ 371 (c)(1),
(2) Date: Mar. 21, 2022

(87) PCT Pub. No.: WO2021/053033
PCT Pub. Date: Mar. 25, 2021

(65) Prior Publication Data
US 2022/0384715 A1    Dec. 1, 2022

(30) Foreign Application Priority Data
Sep. 19, 2019 (FR) ..................... 1910317

(51) Int. Cl.
*H10N 50/10* (2023.01)
*G01Q 60/54* (2010.01)
(Continued)

(52) U.S. Cl.
CPC ............ *H10N 50/10* (2023.02); *G01Q 60/54* (2013.01); *G01R 33/093* (2013.01);
(Continued)

(58) Field of Classification Search
CPC .... H10N 50/10; G01R 33/093; G01R 33/098; G01R 33/1215; G01R 33/14; G01R 33/16;
(Continued)

(56) References Cited

U.S. PATENT DOCUMENTS

2006/0067016 A1* 3/2006 Childress ............. G11B 5/3909
360/324.12
2007/0115596 A1    5/2007 Nakabayashi et al.
(Continued)

FOREIGN PATENT DOCUMENTS

EP    2 060 875 A1    5/2009
EP    3 531 153 A1    8/2019
(Continued)

OTHER PUBLICATIONS

International Search Report as issued in International Patent Application No. PCT/EP2020/075896, dated Mar. 23, 2021.
(Continued)

*Primary Examiner* — Herve-Louis Y Assouman
*Assistant Examiner* — Christopher M Roland
(74) *Attorney, Agent, or Firm* — Pillsbury Winthrop Shaw Pittman LLP (57) ABSTRACT

A magnetoresistive stack includes a reference layer including a magnetic layer, an antiferromagnetic layer in exchange coupling with the magnetic layer, a magnetic layer substantially of the same magnetisation as the magnetic layer, a spacer layer between the magnetic layers with a thickness for enabling an antiferromagnetic coupling between the magnetic layers of a first coupling intensity, a free layer
(Continued)

having a coercivity of less than 10 microTesla, the free layer including a magnetic layer, an antiferromagnetic layer in exchange coupling with the magnetic layer, a magnetic layer substantially of the same magnetisation as the magnetic layer, a spacer layer between the magnetic layers with a thickness for enabling an antiferromagnetic coupling between the magnetic layers of a second coupling intensity lower than the first coupling intensity, a third spacer layer separating the reference and free layers.

10 Claims, 6 Drawing Sheets

(51) Int. Cl.
- *G01R 33/09* (2006.01)
- *G01R 33/12* (2006.01)
- *G01R 33/16* (2006.01)
- *H01F 10/32* (2006.01)
- *G01R 33/14* (2006.01)

(52) U.S. Cl.
CPC ....... *G01R 33/098* (2013.01); *G01R 33/1215* (2013.01); *G01R 33/16* (2013.01); *H01F 10/3254* (2013.01); *H01F 10/3272* (2013.01); *G01R 33/14* (2013.01)

(58) Field of Classification Search
CPC .. G01Q 60/54; H01F 10/3254; H01F 10/3272
See application file for complete search history.

(56) References Cited

U.S. PATENT DOCUMENTS

| | | | |
|---|---|---|---|
| 2009/0271142 A1* | 10/2009 | Yamashita | G01D 3/036 702/141 |
| 2010/0141242 A1* | 6/2010 | Abe | G01D 5/145 324/207.11 |
| 2011/0061139 A1 | 3/2011 | Oral et al. | |
| 2015/0192648 A1* | 7/2015 | Campiglio | G11B 5/39 324/252 |
| 2016/0359103 A1* | 12/2016 | Fermon | G11B 5/3909 |
| 2019/0259520 A1* | 8/2019 | Lassalle-Balier | H01F 10/3268 |
| 2019/0376785 A1* | 12/2019 | Shen | G01N 29/043 |

FOREIGN PATENT DOCUMENTS

| | | |
|---|---|---|
| JP | H10-19907 A | 1/1998 |
| JP | H11-223647 A | 8/1999 |
| WO | WO 2015/105830 A1 | 7/2015 |
| WO | WO 2015/105836 A1 | 7/2015 |
| WO | WO 2016/081833 A2 | 5/2016 |
| WO | WO 2016/196157 A1 | 12/2016 |

OTHER PUBLICATIONS

Gregušová, D., et la., "Technology and properties of a vector hall sensor," Microelectronics Journal, vol. 37, No. 12, Dec. 2006, pp. 1543-1546.

Costa, J. D., et al., "Impact of MgO Thickness on the Performance of Spin-Transfer Torque Nano-Oscillators," IEEE Transactions on Magnetics, vol. 51, No. 11, Nov. 2015, 4 pages.

* cited by examiner

MAGNETORESISTIVE STACK WITHOUT RADIATED FIELD, SENSOR AND MAGNETIC MAPPING SYSTEM COMPRISING SUCH A STACK

CROSS-REFERENCE TO RELATED APPLICATIONS

This application is the U.S. National Stage of PCT/EP2020/075896, filed Sep. 16, 2020, which in turn claims priority to French patent application number 1910317 filed Sep. 19, 2019. The content of these applications are incorporated herein by reference in their entirety.

TECHNICAL FIELD OF THE INVENTION

The technical field of the invention is that of magnetoresistive stacks.

The present invention relates to a magnetoresistive device having a stack of magnetic and non-magnetic layers making it possible to have great sensitivity independently of the size of the device and not to have a radiated magnetic field.

TECHNOLOGICAL BACKGROUND OF THE INVENTION

Magnetoresistive sensors are the subject of numerous developments and are currently widely used for current and field detection. A magnetoresistive sensor sees its resistance change as a function for example of the magnetic field to which it is subjected.

Several types exist, which include giant magnetoresistance (GMR), tunnel magnetoresistance (TMR) and anisotropic magnetoresistance (AMR). GMR and TMR operate by spintronics. The resistance of GMR or TMR is linked to the angular direction of the magnetisation of one or more of their layers. Thus, when an external magnetic field is applied to such sensors, GMR and TMR see the magnetisation direction of one or more of their layers change, which implies an increase or a decrease in the resistance of the sensor.

A common configuration of this type of sensor is called spin valve, in which a so-called "reference" layer has a fixed magnetisation, the magnetisation direction of which determines the direction of sensitivity of the sensor and a so-called "free" layer is capable of orienting its magnetisation according to an external field. A non-magnetic spacer separates the free layer from the reference layer.

In a spin valve, the resistance is linked to the angular direction of the magnetisation of its free layer compared to the magnetisation direction of its reference layer. The reference layer is made "hard" by an antiferromagnetic layer of the reference layer. The "hardness" of a magnetic layer is defined with respect to the value of the coercive magnetic field necessary for the reversal of the magnetisation of the layer. A magnetic layer will thus be considered "harder" than another if its coercive field is stronger. Thus, in a spin valve, the reference layer is a "hard" layer whereas the free layer is a "soft" layer.

The coercive field of a ferromagnetic material corresponds to the intensity of magnetic field to apply to the material having reached its magnetisation at saturation to obtain the reversal of its magnetisation. In the case of spin valves, the reference layer has a coercive field more important than the coercive field of the free layer in order that the magnetisation direction of the reference layer does not vary when the magnetisation direction of the free layer is modified.

A good insight into recent advances in the field of nanomagnetism and notably magnetoresistive sensors may be found in "Nanomagnetism, applications and perspectives" (C. Fermon and M. Van der Voorde, Wiley, 2017).

In order to have a linear response in a spin valve, several improvements have been proposed, in particular the coupling of the free layer to a second reference layer, using a tantalum (Ta) or ruthenium (Ru) coupling, even in stacks containing a plurality of reference layers and free layers. These improvements are for example described in the documents WO 2015/105830 A1, WO 2015/105836 A1 or WO 2016/196157 A1.

A majority of the stacks covered by these works comprise a free layer made of CoFe/NiFe for GMR and CoFeB/NiFe for TMR. The drawback of this approach is to have a quite important magnetic moment of the free layer. Consequently, the sensitivity of the device depends on the size of the stack, that is to say that the sensitivity decreases when a lateral dimension of the device is reduced due to the internal dipolar field. Another drawback of this approach is to have a field radiated by the sensor, which can induce a coupling to other sensor devices or to other objects and thus act on the results of neighbouring sensor devices and/or imply a noise in the specific detection of the sensor.

There thus exists a need to have a magnetoresistive stack sensitive to external magnetic fields not creating a radiated magnetic field and having a sensitivity independent of its size.

SUMMARY OF THE INVENTION

The invention offers a solution to the aforementioned problems, by making it possible to have a magnetoresistive stack not being a source of radiated field while having a sensitivity that does not decrease with its size and sensitive to external magnetic fields.

One aspect of the invention relates to a magnetoresistive stack comprising at least:
A reference layer comprising at least:
  A first magnetic layer,
  A first antiferromagnetic layer in exchange coupling with the first magnetic layer,
  A second magnetic layer substantially of the same magnetisation as the first magnetic layer,
  A first non-magnetic spacer layer between the first magnetic layer and the second magnetic layer with a thickness enabling an antiferromagnetic RKKY coupling between the first magnetic layer and the second magnetic layer, said antiferromagnetic RKKY coupling having a first coupling intensity,
A free layer having a coercivity lower than 10 microTesla, the free layer comprising at least:
  A third magnetic layer,
  A second antiferromagnetic layer in exchange coupling with the third magnetic layer,
  A fourth magnetic layer substantially of the same magnetisation as the third magnetic layer,
  A second non-magnetic spacer layer between the third magnetic layer and the fourth magnetic layer with a thickness enabling an antiferromagnetic RKKY coupling between the third magnetic layer and the fourth magnetic layer, said antiferromagnetic RKKY coupling having a second coupling intensity lower than the first coupling intensity, A third non-magnetic spacer layer separating the reference layer and the free layer.

The invention uses two layers of synthetic antiferromagnetic (SAF) type as reference layer and as free layer, which makes it possible to improve the independence of the sensitivity of the stack to the size of the stack, the dipolar fields of each of the reference and free layers being considerably reduced in SAFs.

Although having two layers of synthetic antiferromagnetic type, the stack according to the invention has all the same a free layer, because one of the two synthetic antiferromagnetic layers has an intensity of antiferromagnetic coupling between its magnetic layers lower than the intensity of antiferromagnetic coupling between the magnetic layers of the other layer, in order that the free layer has a sensitivity to external magnetic fields and that the other layer, the reference layer, fixes the direction of sensitivity of the stack.

Further, the total magnetic moment of the reference layer is zero and the total magnetic moment of the free layer is zero, which makes it possible to have no radiated field, either by the reference layer, or by the free layer. "No radiated field" is taken to mean that the stack radiates a maximum field of 1 mT at 100 nm distance from the stack. The magnetoresistive stack according to the invention thus has a zero total magnetic moment and no radiated field according to the definition given previously. The total magnetic moment of the reference layer is zero because the two magnetic layers that it comprises are compensated in magnetisation intensity, that is to say that the two magnetic layers have substantially the same magnetisation intensity, and are in antiferromagnetic RKKY coupling, that is to say that their respective magnetisation is antiparallel, making it possible to have zero magnetisation of the reference layer. RKKY (Ruderman-Kittel-Kasuya-Yosida) coupling is an interaction between the magnetic moments of two magnetic layers separated by a non-magnetic layer. This antiferromagnetic RKKY coupling is ensured by the presence of a non-magnetic spacer layer between the two coupled magnetic layers. By modifying the thickness of the non-magnetic spacer layer, the RKKY coupling between the two magnetic layers oscillates and goes from ferromagnetic to antiferromagnetic. This phenomenon is described by the document: Parkin et al, Phys. Rev. Lett. Vol 67 p 3598, 1991.

In the same way, the free layer has a zero total magnetic moment because the two magnetic layers that it comprises are compensated in magnetisation intensity, and are in antiferromagnetic RKKY coupling, that is to say that their respective magnetisation is antiparallel, making it possible to have zero magnetisation of the free layer.

Apart from the characteristics that have been described in the preceding paragraph, the magnetoresistive stack according to one aspect of the invention may have one or more complementary characteristics among the following, considered individually or according to all technically possible combinations thereof:

the magnetoresistive stack is a giant magnetoresistance, the third non-magnetic spacer layer is a tunnel barrier and in that the magnetoresistive stack is a magnetoresistance tunnel.

Another aspect of the invention relates to a magnetoresistive sensor comprising at least one magnetoresistive stack according to the invention.

Apart from the characteristics that have been described in the preceding paragraph, the magnetoresistive sensor according to one aspect of the invention may have one or more complementary characteristics among the following, considered individually or according to all technically possible combinations thereof:

the magnetoresistive sensor comprises a tetrahedral shaped support, in that it comprises four magnetoresistive stacks according to the invention and in that the four magnetoresistive stacks are each arranged on a different face of the tetrahedral shaped support, the magnetoresistive sensor comprises a flexible lever arm, said lever arm comprising at its end the tetrahedral support comprising said four magnetoresistive stacks, Another aspect of the invention relates to a system for magnetically mapping at least one magnetic sample comprising at least one magnetoresistive sensor according to the invention for detecting the leakage fields emitted by the magnetic sample, a scanning system and a first current source configured to create a first magnetic field applied to the magnetic sample.

Apart from the characteristics that have been described in the preceding paragraph, the magnetic mapping system according to one aspect of the invention may have one or more complementary characteristics among the following, considered individually or according to all technically possible combinations thereof:

the first magnetic field created by the first current source is a static magnetic field, in that the magnetic mapping system comprises a second current source configured to create a dynamic magnetic field applied to the magnetic sample, the dynamic magnetic field is created at a first frequency, the magnetoresistive sensor is supplied at a second frequency, each signal captured by the magnetoresistive sensor comprises:
  a first continuous signal emitted by the sample subjected to the static magnetic field and
  a second alternating signal emitted by the sample subjected to the dynamic magnetic field, each signal captured by the magnetoresistive sensor is demodulated at the second frequency to recover the first continuous signal emitted by the sample subjected to the static magnetic field and each signal captured by the magnetoresistive sensor is demodulated at the frequency corresponding to the subtraction of the first frequency from the second frequency to recover the second alternating signal emitted by the sample subjected to the dynamic magnetic field.

The invention and the different applications thereof will be better understood on reading the description that follows and by examining the figures that accompany it.

BRIEF DESCRIPTION OF THE FIGURES

The figures are presented for indicative purposes and in no way limit the invention.

DETAILED DESCRIPTION

The figures are presented for indicative purposes and in no way limit the invention.

Unless stated otherwise, a same element appearing in the different figures has a single reference.

Figure 1:
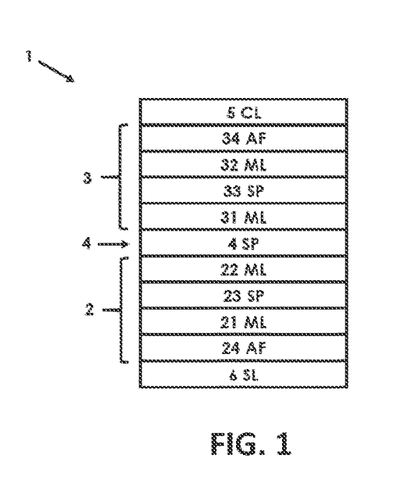
FIG. 1 shows a schematic representation of a magnetic stack according to the invention.

FIG. 1 shows a schematic representation of a magnetic stack according to the invention.

The magnetic stack 1 according to the invention comprises a reference layer 2, a free layer 3 and a non-magnetic spacer layer 4.

Reference Layer 2

The reference layer 2 is a layer of synthetic antiferromagnetic (SAF) type comprising an antiferromagnetic layer 24 AF, two magnetic layers 21 ML and 22 ML, and a non-magnetic spacer layer 23 SP.

Substantially Equal Magnetisation of the Two Magnetic Layers 21 ML and 22 ML According to the invention, the two magnetic layers 21 ML and 22 ML are chosen to have substantially the same magnetisation, whatever the operating temperature of the stack 1. "Substantially" the same magnetisation is taken to mean a difference in magnetisation of one magnetic layer of the two magnetic layers 21 ML and 22 ML compared to the other magnetic layer of the two magnetic layers 21 ML and 22 ML of more or less 10%, preferentially 5%. Thus, the magnetisation of the two magnetic layers 21 ML and 22 ML is "substantially the same" if the second magnetic layer 22 ML has a magnetisation of more or less 10%, preferentially 5%, the magnetisation of the first magnetic layer 21 ML.

Antiferromagnetic Coupling Between the Two Magnetic Layers 21 ML and 22 ML

Figure 2:
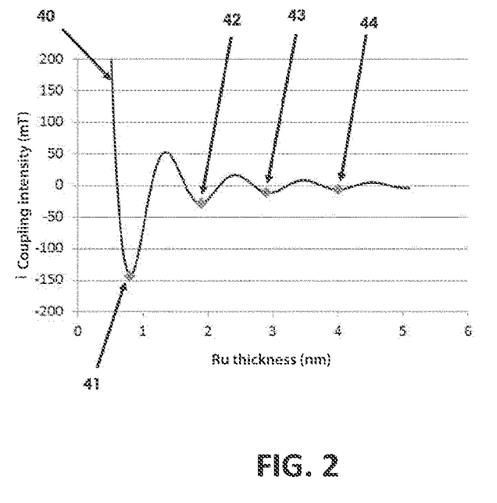
FIG. 2 shows a curve representing the RKKY coupling of two Co90Fe10 layers separated by a spacer layer made of ruthenium as a function of the thickness of the spacer layer.

Further, the two magnetic layers 21 ML and 22 ML are antiferromagnetically coupled by an antiferromagnetic RKKY (Ruderman-Kittel-Kasuya-Yosida) coupling. RKKY coupling is an interaction between the magnetic moments of two magnetic layers separated by a non-magnetic layer. This antiferromagnetic RKKY coupling is enabled by the presence of a non-magnetic spacer layer 23 SP between the two magnetic layers 21 ML and 22 ML. By modifying the thickness of the non-magnetic spacer layer 23 SP, the RKKY coupling between the magnetic layers 21 ML and 22 ML oscillates and goes from ferromagnetic to antiferromagnetic. This phenomenon is described by the document: Parkin et al, Phys. Rev. Lett. Vol 67 p 3598, 1991 and is represented in FIG. 2. The non-magnetic spacer layer 23 SP may be composed of Ru, Ir, Rh, Cu, or any other non-magnetic material making it possible, at one or several determined thicknesses, to have an antiferromagnetic RKKY coupling between two adjacent magnetic layers.

FIG. 2 shows a curve representing the RKKY coupling of two magnetic Co90Fe10 layers separated by a spacer layer made of ruthenium as a function of the thickness of the spacer layer.

This curve is obtained by determining the coupling intensity of the two magnetic layers for each thickness of the spacer. It is thus necessary to deposit several stacks with different thicknesses of spacer. On each stack, the RKKY coupling intensity is obtained by applying a sufficiently strong field to the stack. The field corresponding to the moment where the magnetisation goes from zero magnetisation to a magnetisation two times the magnetisation is then the field corresponding to the RKKY coupling intensity. This field may be measured using for example a so-called VSM (Vibrating Sample Magnetometer) measurement apparatus. The VSM is capable of measuring the magnetic properties of a sample. Its principle rests on a flux method which consists in measuring the flux induced F in a coil by periodic displacement of the sample. More specifically, a sample placed at the centre of a measurement coil is vibrated vertically, that is to say along the z axis perpendicular to the plane of the layers of the sample, with a constant amplitude. The voltage induced in the detection coils by a sample of magnetic moment p is obtained from the reciprocity theorem:

$$F = \left(\frac{B}{I}\right)\mu, \quad \text{[Math. 1]}$$

where B is the magnetic field that would be produced by a fictional current I flowing in the detection coils.

The induced voltage e is given by the relationship:

$$e = -\frac{dF}{dt} = -\mu\frac{d\left(\frac{B}{I}\right)}{dz}\cdot\frac{dz}{dt} \quad \text{[Math. 2]}$$

The induced voltage e is proportional to the magnetic moment of the sample but does not depend on the intensity of the applied magnetic field. One of the interests of this measuring method is its rapidity because bothersome parasitic drifts are pseudo-continuous signals easily eliminated by the synchronous detection of the VSM.

It is also possible to determine the coupling intensity using another measurement apparatus known as a MOKE (Magneto-Optical Kerr Effect) magnetometer. This magnetometer makes it possible to measure hysteresis curves as a function of temperature and the applied magnetic field. The MOKE magnetometer uses for this purpose the magneto-optic Kerr effect which describes the changes in polarisation and intensity of light reflected on a magnetic surface. Thanks to the MOKE magnetometer, it is possible to characterise the magnetisation and notably the magnetisation direction of the studied layer(s). Any other magnetometer may also be used (for example a SQUID magnetometer).

It may be observed in FIG. 2 that the curve 40 of coupling between two magnetic Co90Fe10 layers separated by a non-magnetic Ru spacer layer as a function of the thickness of the non-magnetic Ru spacer layer varies in the manner of a damped sinusoid. At the extrema of curve 40, the RKKY coupling between the two magnetic layers is either ferromagnetic if the extremum is a maximum, or antiferromagnetic if the extremum is a minimum. When the coupling intensity is zero, that is to say at the thicknesses of non-magnetic spacer layer where the damped sinusoidal curve crosses zero, the angle between the magnetisation directions of the two magnetic layers is 90°.

In a stack of SAF type layers, the coupling between the two magnetic layers separated by a non-magnetic spacer layer is chosen to be antiferromagnetic. Thus, it is necessary to choose a thickness of non-magnetic spacer layer corresponding to one of the minima 41 to 44 of the coupling curve 40.

The higher the coupling intensity, the stronger the coupling, it will then be more difficult to change the magnetisation direction of these layers, a more important external magnetic field then having to be applied.

For example, point 41 of curve 40 is a minimum, the coupling between the two magnetic Co90Fe10 layers separated by a non-magnetic Ru spacer layer of 0.85 nm thickness is then antiferromagnetic of maximum intensity for such an antiferromagnetic coupling of 145 mT (for milliTesla). A coupling of negative intensity on the curve 40 is an antiferromagnetic coupling having an intensity equal to the norm of the negative coupling intensity. For example, at point 41, a coupling intensity of around −145 mT is read. The value of the intensity of the antiferromagnetic coupling at point 41 is then around 145 mT.

Point 42 of curve 40 is the second minimum of curve 40. It corresponds to an antiferromagnetic coupling of weaker intensity, that is to say of 40 mT intensity, for a thickness of 1.9 nm of non-magnetic Ru spacer layer.

Point 43 of curve 40 is the third minimum of curve 40. It corresponds to an antiferromagnetic coupling of weaker intensity than the first minimum 41 and than the second minimum 42 (intensity at point 43 of 20 mT, for a thickness of 2.9 nm of non-magnetic Ru spacer layer).

Point 44 of curve 40 is the fourth minimum of curve 40. It corresponds to an antiferromagnetic coupling of weaker intensity than the first minimum 41, than the second minimum 42 and than the third minimum 43 (intensity at point 44 of 10 mT, for a thickness of 4 nm of non-magnetic Ru spacer layer).

Exchange Coupling Between the Antiferromagnetic Layer 24 AF and the Magnetic Layer 21 ML The reference layer 2 of the magnetoresistive stack according to the invention comprises an antiferromagnetic trapping layer 24 AF. The antiferromagnetic layer 24 AF and the first magnetic layer 21 ML are coupled by an exchange coupling. This exchange coupling creates interface phenomena which strongly influence the magnetisation of the first magnetic layer 21 ML. This coupling induces several effects on the hysteresis cycle of the first magnetic layer 21 ML, notably an increase in the coercivity and a shift of the hysteresis cycle compared to the zero field. In the reference layer, the antiferromagnetic trapping layer 24 AF makes it possible to trap the magnetic layer 21 ML in a given magnetisation direction. The magnetic layer 21 ML is in a strong antiferromagnetic RKKY coupling with the magnetic layer 22 ML, thus producing a hard reference layer 2. The antiferromagnetic trapping layer 24 AF is a layer of PtMn, IrMn, NiMn, of any other composition of these metals, or any other combination of metals or oxides having antiferromagnetic properties and enabling an exchange coupling.

The exchange coupling between the antiferromagnetic layer 24 AF and the first magnetic layer 21 ML induces a change in the magnetisation of the first magnetic layer 21 ML. This modification of the magnetisation of the first magnetic layer 21 ML may be due for example to an intermixing at the interface of the antiferromagnetic layer 24 AF which slightly reduces the magnetic moment of the magnetic layer 21 ML, to roughness effects, etc. Thus, unlike what may be proposed by the prior art, the thicknesses and materials of the first magnetic layer 21 ML and the second magnetic layer 22 ML are not necessarily taken identical. Indeed, the invention seeking to resolve notably the problem of having no radiated field in a magnetoresistive stack, it is necessary that all of the reference layer 2 has a zero total magnetisation. The second magnetic layer 22 ML must thus have a thickness and a material such that the magnetisation of the second magnetic layer 22 ML is substantially the same, whatever the operating temperature of the stack 1, as the magnetisation of the first magnetic layer 21 ML modified by the presence of the antiferromagnetic layer 24 AF. Preferentially, the same material will be used for the two magnetic layers 21 ML and 22 ML and the thicknesses of the magnetic layers 21 ML and 22 ML will thus be adapted so as to have a zero total magnetisation of the reference layer 2. The magnetic layers 21 ML and 22 ML may be made of at least one material among cobalt Co, iron Fe, nickel Ni, zirconium Zr, boron B, or any other material known to those skilled in the art making it possible to have magnetic layers with strong spin polarisation. The embodiments described hereafter in the description will use for example magnetic layers of CoFe10 for GM R and CoFe10 and CoFeB for TMR.

Free Layer 3

The free layer 3 is a synthetic antiferromagnetic (SAF) type layer comprising an antiferromagnetic layer 34 AF, two magnetic layers 31 ML and 32 ML, and a non-magnetic spacer layer 33 SP.

Substantially Equal Magnetisation of the Two Magnetic Layers 31 ML and 32 ML

In the same way as for the reference layer 2, the two magnetic layers 31 ML and 32 ML of the free layer 3 are chosen to have substantially the same magnetisation, whatever the operating temperature of the stack 1. "Substantially" the same magnetisation is taken to mean a difference in magnetisation of one magnetic layer of the two magnetic layers 31 ML and 32 ML compared to the other magnetic layer of the two magnetic layers 31 ML and 32 ML of more or less 10%, preferentially 5%. Thus, the magnetisation of the two magnetic layers 31 ML and 32 ML is "substantially the same" if the third magnetic layer 31 ML has a magnetisation of more or less 10%, preferentially 5%, of the magnetisation of the fourth magnetic layer 32 ML.

Antiferromagnetic Coupling Between the Two Magnetic Layers 31 ML and 32 ML

Further, as for the magnetic layers 21 ML and 22 ML of the reference layer 2, the two magnetic layers 31 ML and 32

ML are antiferromagnetically coupled by an antiferromagnetic RKKY (Ruderman-Kittel-Kasuya-Yosida) coupling. This antiferromagnetic RKKY coupling is ensured by the presence of the non-magnetic spacer layer 33 SP between the two magnetic layers 31 ML and 32 ML. By modifying the thickness of the non-magnetic spacer layer 33 SP, the RKKY coupling between the magnetic layers 31 ML and 32 ML oscillates and goes from ferromagnetic to antiferromagnetic. This phenomenon is represented in FIG. 2. The non-magnetic spacer layer 33 SP may be composed of Ru, Ir, Rh, Cu, or any other non-magnetic material enabling, at one or several certain thicknesses, an antiferromagnetic RKKY coupling between two adjacent magnetic layers.

Exchange Coupling Between the Antiferromagnetic Layer 34 AF and the Magnetic Layer 32 ML In the same way as in the reference layer 2, in the free layer 3, an antiferromagnetic trapping layer 34 AF is present and is a layer of PtMn, IrMn, NiMn, any other composition of these metals, or any other combination of metals having antiferromagnetic properties and enabling an exchange coupling.

In the free layer 3, an exchange coupling between the antiferromagnetic layer 34 AF and the fourth magnetic layer 32 ML of the stack 1 according to the invention induces a change in the magnetisation of the third magnetic layer 31 ML. The third magnetic layer 31 ML must thus have a thickness and a material such that the magnetisation of the third magnetic layer 31 ML is substantially the same, whatever the operating temperature of the stack 1, as the magnetisation of the fourth magnetic layer 32 ML modified by the presence of the antiferromagnetic layer 34 AF. Preferentially, the same material will be used for the two magnetic layers 31 ML and 32 ML and the thicknesses of the magnetic layers 31 ML and 32 ML will thus be adapted so as to have a zero total magnetisation of the free layer 3. The magnetic layers 31 ML and 32 ML may be made of at least one material among cobalt Co, iron Fe, nickel Ni, zirconium Zr, boron B, or any other material known to those skilled in the art making it possible to have magnetic layers with strong spin polarisation. As indicated previously, the embodiments described hereafter in the description will use for example magnetic layers of CoFe10 for GM R and CoFe10 and CoFeB for TMR.

Difference in RKKY Between the Magnetic Layers of the Reference Layer 2 and the Magnetic Layers of the Free Layer 3

The magnetoresistive stack 1 according to the invention represented in FIG. 1 comprises a reference layer 2 and a free layer 3. Each of these two respectively reference 2 and free 3 layers comprises two antiferromagnetically coupled magnetic layers, respectively 21 ML-22 ML and 31 ML-32 ML, this antiferromagnetic RKKY coupling being enabled by the presence of a non-magnetic spacer layer, respectively 23 SP and 33 SP. The reference layer 2, comprising the magnetic layers 21 ML and 22 ML separated by the non-magnetic spacer layer 23 SP, has a stronger coupling intensity between its magnetic layers 21 ML and 22 ML than the free layer 3 comprising the magnetic layers 31 ML and 32 ML separated by the non-magnetic spacer layer 33 SP, in order that, in the presence of an external magnetic field, only the free layer 3 is sensitive to this external magnetic field, and that the reference layer 2 does not see its magnetisation direction modified.

According to the invention, the thickness of each of the spacers 23 SP and 33 SP is chosen to have an antiferromagnetic coupling in each of the reference 2 and free 3 layers, and so that the antiferromagnetic coupling between the two magnetic layers of the reference layer 2 has a more important coupling intensity than the antiferromagnetic coupling between the two magnetic layers of the free layer 3. This makes it possible to have one layer freer than the other while having two SAF type layers in order to have no radiated magnetic field.

The thickness of the first non-magnetic spacer layer 23 SP is chosen to enable a strong intensity of antiferromagnetic RKKY coupling between the two magnetic layers 21 ML and 22 ML. To do so, the curve representing the RKKY coupling between the two magnetic layers 21 ML and 22 ML as a function of the thickness of the non-magnetic spacer layer 23 SP is determined by characterising the magnetic properties of the two magnetic layers 21 ML and 22 ML using a VSM or a MOKE magnetometer or any other magnetometer. To enable a strong coupling intensity between the two magnetic layers 21 ML and 22 ML, a thickness of non-magnetic spacer layer 23 SP corresponding to the highest possible intensity may be chosen. For example, in the case where the non-magnetic spacer layer 23 SP is made of Ru, and where the magnetic layers 21 ML and 22 ML are made of Co90Fe10, the thickness corresponding to the first point of curve 40 of FIG. 2 may be chosen.

Thus, the first coupling intensity of the magnetic layers 21 ML and 22 ML of the reference layer 2 is determined to be strong, that is to say so that it is possible to find at least one weaker coupling intensity for the free layer 3. In order to ensure that this criterion will be met, it is possible of take the thickness corresponding to the highest possible coupling intensity for the first non-magnetic spacer layer 23 SP.

According to the invention, the thickness of the second non-magnetic spacer layer 33 SP is chosen to enable an intensity of antiferromagnetic RKKY coupling between the third magnetic layer 31 ML and the fourth magnetic layer 32 ML that is lower than the intensity of antiferromagnetic RKKY coupling between the first magnetic layer 21 ML and the second magnetic layer 22 ML. To do so, the curve representing the RKKY coupling between the two magnetic layers 31 ML and 32 ML as a function of the thickness of the non-magnetic spacer layer 33 SP is determined by characterising the magnetic properties of the two magnetic layers 31 ML and 32 ML using a VSM, a MOKE or SQUID magnetometer. To enable an intensity of antiferromagnetic RKKY coupling between the two magnetic layers 31 ML and 32 ML that is lower than the intensity of antiferromagnetic RKKY coupling between the two magnetic layers 21 ML and 22 ML, a thickness of non-magnetic spacer layer 33 SP may be chosen by determining on the curve representing the RKKY coupling between the two magnetic layers 31 ML and 32 ML as a function of the thickness of the non-magnetic spacer layer 33 SP all of the minima of the curve having a dampened sinusoidal shape and by choosing one of the minima of the curve corresponding to an intensity of which the norm value is lower than the norm value of the coupling intensity chosen for the reference layer 2. For example, in the case where the non-magnetic spacer layer 33 SP is made of Ru, where the magnetic layers 31 ML and 32 ML are made of Co90Fe10, and where the thickness corresponding to the first point of curve 40 of FIG. 2 has been chosen for the spacer 23 SP, the second minimum 42, the third minimum 43 or the fourth minimum 44 of curve 40 may be chosen.

In the embodiment represented by curve 40 in FIG. 2, that is to say in the case of spacers 23 SP and 33 SP of Ru and magnetic layers 21 ML, 22 ML, 31 ML and 32 ML of Co90Fe10, and when the first minimum 41 is chosen for the coupling of the reference layer 2 and when the second minimum 42 is chosen for the coupling of the free layer 3, the coupling of the free layer 3 is around 40 mT, which gives the free layer 3 of the stack 1 according to the invention a wide measurement range when the stack 1 is comprised in a magnetic field sensor. Another thickness of the spacer layer 33 SP of 2.9 nm or 4 nm, respectively corresponding to the minima 43 or 44, respectively corresponding to coupling intensities of 20 mT or 10 mT, may be chosen. The lower the intensity of the coupling between the magnetic layers 31 ML and 32 ML of the free layer 3, the greater the sensitivity of the free layer 3 of the stack 1 comprised in a sensor and the more reduced the measurement range.

Thus, the second coupling intensity, that is to say the intensity of coupling of the magnetic layers 31 ML and 32 ML of the free layer 3, is determined to be lower than the first coupling intensity, that is to say the intensity of coupling of the magnetic layers 21 ML and 22 ML of the reference layer 2, and does so in order that the free layer 3 is sensitive to external magnetic fields along a direction of sensitivity fixed by the reference layer 2, the reference layer 2 then not being or being little sensitive to the external magnetic fields that it is wished to measure.

The stack 1 according to the invention thus comprises a reference layer 2, of strong coercivity, a free layer 3 having a coercivity lower than the coercivity of the reference layer 2, and a spacer 4. This difference in RKKY coupling intensity between the magnetic layers of the free 3 and reference 2 layers makes it possible to have a stack of which one layer defines the direction of sensitivity of the stack to external magnetic fields and of which another layer is sensitive to external magnetic fields in the direction defined by the first layer. Further, the reference 2 and free 3 layers are of SAF type, which makes it possible to have a stack of which the sensitivity is independent of its size. Finally, each of the reference 2 and free 3 layers has a zero total magnetisation, on account of the compensation in magnetisation of its magnetic layers 21 ML and 22 ML and 31 ML and 32 ML, making it possible to have no radiated field, or a very weak radiated field (maximum 1 mT at 100 nm distance).

The coercivity of the free layer 3 must be sufficiently low so that the stack 1 can be used in a sensor. Also, the free layer 3 must have a zero or very weak coercivity, that is to say a magnetic coercive field lower than 10 µT. To do so, it is necessary to use for 31M L and 32M L magnetic materials having low intrinsic coercivity such as NiFe, CoFeB or a Heusler alloy for example, and to have a moderate antiferromagnetic coupling. It is possible to ensure that the coercivity value of the free layer 3 is much lower than the threshold of 10 µT while carrying out a measurement of the hysteresis cycle of the free layer 3 using a magnetometer, for example a VSM. The coercive field is then determined at the point where the curve crosses the axis of the fields.

In order to obtain a linear response range, it is necessary that the magnetisation direction of the two reference 2 and free 3 layers are oriented at 90 degrees one compared to the other in the absence of external magnetic field. This is done by choosing the material and the thickness of each of the antiferromagnetic layers 24 AF and 34 AF compared to the other.

The spacer layer 4 is a layer making it possible to obtain giant magnetoresistance effect or tunnel magnetoresistance effect in the stack 1 according to the invention, for an application of the stack 1 to magnetic field sensors. This spacer layer 4 is a metal layer to obtain a GMR effect, for example Cu or Cr. This spacer layer 4 is a tunnel barrier to obtain a TMR effect, for example made of MgO or $Al_2O_3$.

Figure 3A:
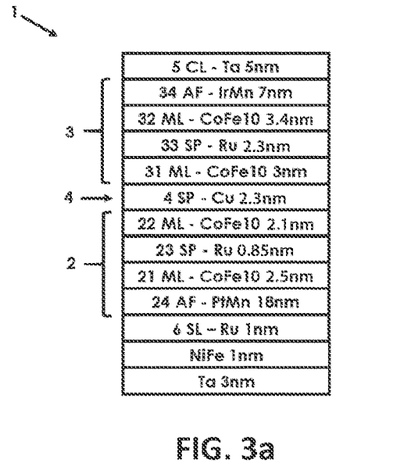
FIG. 3a shows a schematic representation of a magnetic stack of GMR type according to an embodiment of the invention.

FIG. 3a in an embodiment represented in FIG. 3, the stack 1 according to the invention is a magnetoresistive stack of GMR type.

FIG. 3 represents an exemplary stack according to the invention being able to be comprised in a GMR sensor, without this example being limiting.

The stack 1 according to the invention comprises the reference layer 2, the free layer 3 and the spacer layer 4.

The spacer layer 4 is made of Cu 2.3 nm to have a giant magnetoresistance effect in the stack 1.

The reference layer 2 comprises an SAF type stack comprising two magnetic layers 21 ML and 22 ML separated by a spacer 23 SP. The reference layer 2 further comprises a PtMn trapping layer 24 AF. The thickness of the PtMn layer must be greater than 10 nm in order to guarantee sufficient blocking. Thicknesses up to 25 nm are commonly used. The two magnetic layers 21 ML and 22 ML are made of CoFe10. The first magnetic layer 21 ML, in exchange coupling with the antiferromagnetic layer 24 AF, has a thickness of 2.5 nm. The second magnetic layer 22 ML has a thickness chosen to compensate the magnetisation of the first magnetic layer, that is to say so that the magnetisation of the second magnetic layer 22 ML is substantially the same as the magnetisation of the first magnetic layer 21 ML. As indicated previously, and unlike what is commonly done in the prior art, the thickness of the second magnetic layer 22 ML is not identical to the thickness of the first magnetic layer 21 ML, because the first magnetic layer is in exchange coupling with the antiferromagnetic layer AF 24, which implies a modification of the magnetisation of the first magnetic layer 21 ML. Thus, the first magnetic layer 21 ML made of CoFe10 has a thickness of 2.5 nm and the second magnetic layer 22 ML made of CoFe10 has a thickness of 2.1 nm. This makes it possible to have a zero total magnetisation of the reference layer 2. The exact thickness of the magnetic layer 22 ML compared to the magnetic layer 21 ML is determined, for example using a VSM, by measuring the total magnetisation of the reference layer 2. The exact thickness of the magnetic layer 22 ML may further depend on the deposition conditions of the layer, the annealing temperatures and the exact composition of the PtMn antiferromagnetic layer 24 AF. That is why the thickness of the magnetic layer 22 ML must be determined experimentally, for example using a VSM.

The non-magnetic spacer layer 23 SP is made of Ru, of 0.85 nm thickness, enabling a strong antiferromagnetic RKKY coupling between the two magnetic layers 21 ML and 22 ML. Indeed, the thickness of the spacer layer 23 SP has been chosen to enable the strongest possible antiferromagnetic RKKY coupling, that is to say that the thickness corresponding to the first minimum on the curve representing the coupling intensity between two magnetic CoFe10 layers separated by a Ru spacer as a function of the thickness of the spacer has been chosen. Thus, after having plotted this curve, by determining the minima of this curve, a first minimum is obtained corresponding to a thickness of 0.85 nm. At this thickness, the antiferromagnetic coupling between the two magnetic layers 21 ML and 22 ML is equal to around 140 mT. The reference layer 2 is thus a hard layer, the antiferromagnetic coupling between the two magnetic layers 21 ML and 22 ML being strong, the coercivity of the reference layer 2 thus being strong.

The free layer 3 comprises an SAF type stack comprising two magnetic layers 31 ML and 32 ML separated by a spacer 33 SP. The free layer 3 further comprises an IrMn trapping layer 34 AF in order to guarantee an orientation at 90 degrees of the magnetisation direction of the free layer 3 compared to the magnetisation direction of the reference layer 2 in the absence of external magnetic field to have a linear response range of the GM R sensor. The IrMn trapping layer 34 AF has a thickness that must be greater than 5 nm to ensure correct trapping. A thickness of 7 nm is commonly used. The two magnetic layers 31 ML and 32 ML are made of CoFe10. The first magnetic layer 32 ML, in exchange coupling with the antiferromagnetic layer 34 AF, has a thickness of 3.4 nm. The second magnetic layer 31 ML has a thickness chosen to compensate the magnetisation of the first magnetic layer 32 ML, that is to say so that the magnetisation of the second magnetic layer 31 ML is substantially the same as the magnetisation of the first magnetic layer 32 ML. As indicated previously, and unlike what is commonly done in the prior art, the thickness of the second magnetic layer 31 ML is not identical to the thickness of the first magnetic layer 32 ML, because the first magnetic layer 32 ML is in exchange coupling with the antiferromagnetic layer AF 34, which implies a modification of the magnetisation of the first magnetic layer 32 ML. Thus, the first magnetic layer 32 ML made of CoFe10 has a thickness of 3.4 nm and the second magnetic layer 31 ML made of CoFe10 has a thickness of 3 nm. This makes it possible to have a zero total magnetisation of the free layer 3. The exact thickness of the magnetic layer 31 ML compared to the magnetic layer 32 ML is determined, for example using a VSM, by measuring the total magnetisation of the free layer 3. The exact thickness of the magnetic layer 31 ML may further depend on the deposition conditions of the layer, the annealing temperatures and the exact composition of the IrMn antiferromagnetic layer 34 AF. That is why the thickness of the magnetic layer 31 ML must be determined experimentally, for example using a VSM.

The non-magnetic spacer layer 33 SP is made of Ru, of 2 nm thickness, enabling a strong antiferromagnetic RKKY coupling between the two magnetic layers 31 ML and 32 ML. Indeed, the thickness of the spacer layer 33 SP has been chosen to enable an antiferromagnetic RKKY coupling intensity lower than the antiferromagnetic RKKY coupling intensity of the two magnetic layers 21M L and 22 ML of the reference layer 2. Curve 40 of FIG. 2 representing the coupling intensity between two Co90Fe10 magnetic layers separated by a Ru spacer as a function of the thickness of the spacer, this curve cannot be used in the embodiment of a GM R with CoFe10 magnetic layers. By plotting the curve representing the coupling intensity between two CoFe10 magnetic layers separated by a Ru spacer as a function of the thickness of the spacer, then by determining the minima of this curve, a second minimum is obtained corresponding to a thickness of 2 nm. It is also possible of take another minimum, of greater thickness to have a higher sensitivity but a more reduced measurement range. In the case of a chosen thickness corresponding to another minimum of the curve than the first minimum, the antiferromagnetic RKKY coupling intensity between the two magnetic layers 31 ML and 32 ML is then lower than the antiferromagnetic RKKY coupling intensity between the two magnetic layers 21 ML and 22 ML, which makes it possible to have a reference layer 2 and a free layer 3. With a Ru thickness of 2 nm, the antiferromagnetic coupling between the two magnetic layers 31 ML and 32 ML is equal to around 40 mT. The free layer 3 is thus a soft layer, the antiferromagnetic coupling between the two magnetic layers 31 ML and 32 ML being weak, the coercivity of the reference layer 2 thus being weak.

Concerning the trapping of the orientation of the magnetisation of the two reference 2 and free 3 layers, the first annealing temperature is 300° C. with an applied magnetic field of 1T, and the second annealing temperature is 200° C. with an applied magnetic field of 100 mT. These temperatures and magnetic fields are obtained as a function of the magnetic properties of the antiferromagnetic layers 24 AF and 34 AF used and make it possible to fix a relative orientation of the magnetisations of the two antiferromagnetic layers 24 AF and 34 AF at 90 degrees in the absence of external magnetic field. This "re-orientation" at 90 degrees is obtained by two annealings, each annealing being carried out at a moderately high temperature to unblock one of the two antiferromagnetic layers and with an applied magnetic field. Thus, during a first annealing at a moderately high temperature to unblock the strongest antiferromagnetic layer, a first strong magnetic field is applied to align the magnetisation of the strongest antiferromagnetic layer. Next, a second annealing at a moderately high temperature to unblock the weakest antiferromagnetic layer is carried out, during which a second magnetic field less strong than the first strong magnetic field is applied to align the magnetisation of the weakest antiferromagnetic layer without affecting the reference layer.

The "seed layer" is chosen in order to ensure good growth roughness for the following layers. Indeed, an important roughness destroys the magnetoresistive properties of the stack. In the case of GMR, a Ta/NiFe/Ru stack ensures optimal growth on silicon or sapphire substrate. Alternatively, Ta/Ru stacks only may give correct results. In the case of TMRs, a quite thick seed layer containing Ta and Cu or Cu alloys are commonly used. In all cases, the stack must be protected by a cap layer which prevents oxidation from penetrating. The cap layer the most used is Ta but certain materials such as Au or Pt may be used.

Figure 3B:
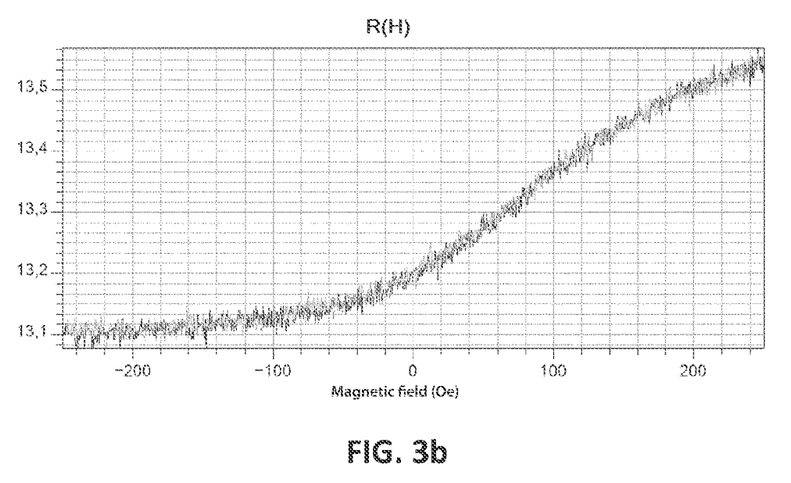
FIG. 3b shows a schematic representation of the response of a magnetic stack of GMR type according to an embodiment of the invention as a function of the applied external magnetic field.

FIG. 3b shows a schematic representation of the response of a magnetic stack of GMR type according to an embodiment of the invention as a function of the applied external magnetic field.

The response curve of FIG. 3b represents the resistance per surface area squared (in Ohms) of the stack 1 according to the invention according to the embodiment of FIG. 3a, that is to say when it is a GM R, as a function of the applied external magnetic field H (in Oersted).

Figure 4:
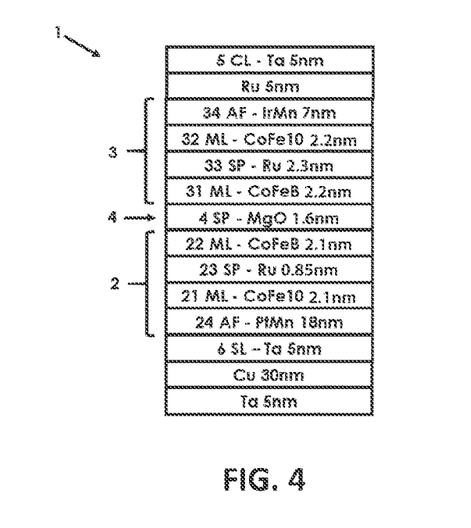
FIG. 4 shows a schematic representation of a magnetic stack of TMR type according to an embodiment of the invention.

FIG. 4 in an embodiment represented in FIG. 4, the stack 1 according to the invention is a magnetoresistive stack of TMR type.

FIG. 4 represents an exemplary stack according to the invention being able to be comprised in a TMR sensor, without this example being limiting.

The stack 1 according to the invention comprises the reference layer 2, the free layer 3 and the spacer layer 4.

The spacer layer 4 is made of 1.6 nm MgO to have a tunnel magnetoresistance effect in the stack 1. To obtain a large TMR effect, the adjacent layers of the tunnel barrier spacer layer 4 are made of CoFeB. Thus, the magnetic layers 31 ML and 22 ML are made of CoFeB.

The reference layer 2 comprises an SAF type stack comprising two magnetic layers 21 ML and 22 ML separated by a spacer 23 SP. The reference layer 2 further comprises a PtMn trapping layer 24 AF. The thickness of the PtMn layer must be greater than 10 nm in order to guarantee sufficient blocking. Thicknesses up to 25 nm are commonly used. The first magnetic layer 21 ML, in exchange coupling with the antiferromagnetic layer 24 AF, has a thickness of 2.1 nm is made of CoFe10. It is preferable to have a magnetic layer 21 ML made of CoFe10 to have a better exchange coupling with the antiferromagnetic layer 24 AF than if a magnetic layer 21 ML made of CoFeB had been used. The second magnetic layer 22 ML has a thickness chosen to compensate the magnetisation of the first magnetic layer 21 ML, that is to say so that the magnetisation of the second magnetic layer 22 ML is substantially the same as the magnetisation of the first magnetic layer 21 ML, while taking into account the fact that the two layers are not made of the same material. In this second embodiment, the first magnetic layer 21 ML made of CoFe10 has a thickness of 2.1 nm and the second magnetic layer 22 ML made of CoFeB has a thickness of 2.1 nm. This makes it possible to have a zero total magnetisation of the reference layer 2. The exact thickness of the magnetic layer 22 ML compared to the magnetic layer 21 ML is determined, for example using an VSM, by measuring the total magnetisation of the reference layer 2. The exact thickness of the magnetic layer 22 ML may further depend on the deposition conditions of the layer, the annealing temperatures and the exact composition of the PtMn antiferromagnetic layer 24 AF. That is why the thickness of the magnetic layer 22 ML must be determined experimentally, for example using a VSM.

The non-magnetic spacer layer 23 SP is made of Ru, of 0.85 nm thickness, enabling a strong antiferromagnetic RKKY coupling between the two magnetic layers 21 ML and 22 ML. Indeed, the thickness of the spacer layer 23 SP has been chosen to enable the strongest possible antiferromagnetic RKKY coupling, that is to say that the thickness corresponding to the first minimum on the curve representing the coupling intensity between a CoFe10 magnetic layer and a CoFeB magnetic layer separated by a Ru spacer as a function of the thickness of the spacer has been chosen. Thus, after having plotted this curve, by determining the minima of this curve, a first minimum corresponding to a thickness of 0.85 nm is obtained. At this thickness, the antiferromagnetic coupling between the two magnetic layers 21 ML and 22 ML is equal to around 150 mT. The reference layer 2 is thus a hard layer, the antiferromagnetic coupling between the two magnetic layers 21 ML and 22 ML being strong, the coercivity of the reference layer 2 thus being strong.

The free layer 3 comprises an SAF type stack comprising two magnetic layers 31 ML and 32 ML separated by a spacer 33 SP. The free layer 3 further comprises an IrMn trapping layer 34 AF in order to guarantee an orientation at 90 degrees of the magnetisation direction of the free layer 3 compared to the magnetisation direction of the reference layer 2 in the absence of external magnetic field to have a linear response range of the GMR sensor. The IrMn trapping layer 34 AF has a typical thickness of 7 nm. This thickness must be greater than 5 nm to ensure sufficient blocking. The first magnetic layer 32 ML, made of CoFe10 and in exchange coupling with the antiferromagnetic layer 34 AF, has a thickness of 2.2 nm. The second magnetic layer 31 ML, made of CoFeB, has a thickness chosen to compensate the magnetisation of the first magnetic layer 32 ML, that is to say so that the magnetisation of the second magnetic layer 31 ML is substantially the same as the magnetisation of the first magnetic layer 32 ML, while taking into account that the alloys of the two layers are different. The first magnetic layer 32 ML made of CoFe10 has a thickness of 2.2 nm and the second magnetic layer 31 ML made of CoFeB has a thickness of 2.2 nm. This makes it possible to have a zero total magnetisation of the free layer 3. The exact thickness of the magnetic layer 31 ML compared to the magnetic layer 32 ML is determined, for example using a VSM, by measuring the total magnetisation of the free layer 3. The exact thickness of the magnetic layer 31 ML may further depend on the deposition conditions of the layer, the annealing temperatures and the exact composition of the IrMn antiferromagnetic layer 34 AF. That is why the thickness of the magnetic layer 31 ML must be determined experimentally, for example using a VSM.

The non-magnetic spacer layer 33 SP is made of Ru, of 2 nm thickness, enabling a strong antiferromagnetic RKKY coupling between the two magnetic layers 31 ML and 32 ML. Indeed, the thickness of the spacer layer 33 SP has been chosen to enable an intensity of antiferromagnetic RKKY coupling lower than the intensity of antiferromagnetic RKKY coupling of the two magnetic layers 21 ML and 22 ML of the reference layer 2. Curve 40 of FIG. 2 representing the coupling intensity between two Co90Fe10 magnetic layers separated by a Ru spacer as a function of the thickness of the spacer, this curve cannot be used in the embodiment of a TMR with CoFeB and CoFe10 magnetic layers. By plotting the curve representing the coupling intensity between a CoFeB magnetic layer and a CoFe10 magnetic layer separated by a Ru spacer as a function of the thickness of the spacer, then by determining the minima of this curve, a second minimum corresponding to a thickness of 1.9 nm is obtained. It is also possible to take another minimum, of greater spacer thickness to have a greater sensitivity but a more reduced measurement range. In the case of a chosen thickness corresponding to another minimum of the curve than the first minimum, the intensity of antiferromagnetic RKKY coupling between the two magnetic layers 31 ML and 32 ML is then lower than the intensity of antiferromagnetic RKKY coupling between the two magnetic layers 21 ML and 22 ML, which makes it possible to have a reference layer 2 and a free layer 3. With a Ru thickness of 1.9 nm, the antiferromagnetic coupling between the two magnetic layers 31 ML and 32 ML is equal to around 20 mT. The free layer 3 is thus a soft layer, the antiferromagnetic coupling between the two magnetic layers 31 ML and 32 ML being weak, the coercivity of the reference layer 2 thus being weak.

In this embodiment, the cancellation of radiated field by compensation of the magnetisations is effective at the temperature of the part but is less effective at higher temperatures, notably due to reactions at different temperatures of the magnetisation of the different magnetic layers of different alloys.

System for Magnetically Mapping a Sample Comprising the Stack 1

A particularly interesting application of the stack 1 according to the invention, and notably of a GMR or TMR sensor comprising the stack 1, is that of magnetic susceptibility mapping of a material. The properties of a material are often correlated, such as its magnetic, crystallographic and mechanical properties. The mapping of the magnetic properties on the surface of a sample makes it possible to access and to complete in a non-destructive manner these other properties. GMR, given their high sensitivity, could be good candidates for the magnetic mapping of samples. However, one of the problems of the use of conventional GMRs for the mapping of samples is their radiated field, which perturbs the mapped surface and thus impact the results.

Thus, the invention further relates to a system for magnetic susceptibility mapping of a material comprising at least one stack 1 according to the invention, a scanning system and a device for generating dynamic and static magnetic fields.

The mapping system comprising at least one stack 1 according to the invention is based on a method different from those proposed until now. The studied material must be magnetic, for example ferromagnetic, antiferromagnetic, ferrimagnetic, paramagnetic, diamagnetic etc., or modify the lines of the applied magnetic field, for example superconductor.

A technique called incremental susceptibility, which consists in measuring the susceptibility of a sample to a given field, is used with a superposition of a DC and AC field. A variable magnetic field and a static magnetic field are applied simultaneously on the material to study. A constraint is that these fields must be applied on the measurement zone and in a homogeneous manner. These fields create a magnetisation in the material. The leakage field created by this magnetisation is measured using a magnetic sensor comprising at least one stack 1 according to the invention. The measurement zone is defined as the zone on which the magnetisation of the sample creates the leakage fields which are measured by the sensor. The leakage fields created by the exterior of the measurement zone are too weak to be measured.

Figure 5:
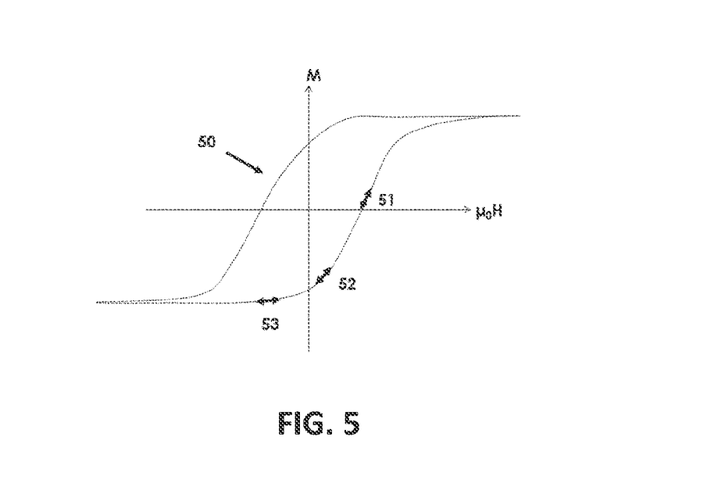
FIG. 5 shows an exemplary magnetic hysteresis cycle 50 corresponding to the magnetisation induced by the application of a magnetic field in a magnetic material.

FIG. 5 shows an exemplary magnetic hysteresis cycle 50 corresponding to the magnetisation induced by the application of a magnetic field in a magnetic material.

A measurement of the leakage field created by the magnetisation of the sample at several static fields makes it possible to describe the hysteresis cycle 50. The magnetic field makes it possible to access several properties. If the field is scanned once slowly, the hysteresis cycle of each point on the surface of the material may be determined. If the field is alternating, the variation in the magnetisation as a function of the magnetic field, that is to say the susceptibility, is obtained and may be measured. If a static field and a dynamic field are applied simultaneously, the magnetic susceptibility of the sample at different positions of its hysteresis cycle 50 may be measured. This property is dependent on the field frequency used.

The magnetic susceptibility may be measured at different points 51, 52 and 53 of the hysteresis cycle 50 thanks to the superposition of a static magnetic field and a dynamic magnetic field. The interest of this double excitation is to be able to obtain additional information on the material and notably what type of magnetism is present. For certain magnetic materials and notably steels, the mechanical properties and the magnetic properties are correlated. Magnetic susceptibility also enables a clear differentiation between the structural phases of steels. The susceptibility imaging of steels thus makes it possible to work back to the local structuring of the grains and thus to monitor the evolution of its mechanical properties, linked to phenomena such as ageing or heat treatment during manufacture. This technique is thus a "material soundness control" tool. Further, a ferromagnetic, ferrimagnetic or antiferromagnetic material will have a different response on the three points 51, 52 and 53 whereas a paramagnetic or diamagnetic material for example will have an identical response on these three points 51, 52 and 53.

Information on the magnetic microstructure of the sample as well as its magnetic properties at the local scale may be obtained with this technique. The phase of the signals must also be measured because it contains information on the manner in which the materials respond to magnetic fields and thus on the material itself.

The static and dynamic magnetic fields may be applied in different directions and at different frequencies for the alternating field of several Hz up to one hundred or so MHz in order to optimise the signal and to adapt the excitation to the type of sample. The choice of the direction and the intensity is going to depend on the type of sample measured and its characteristics.

Figure 6:
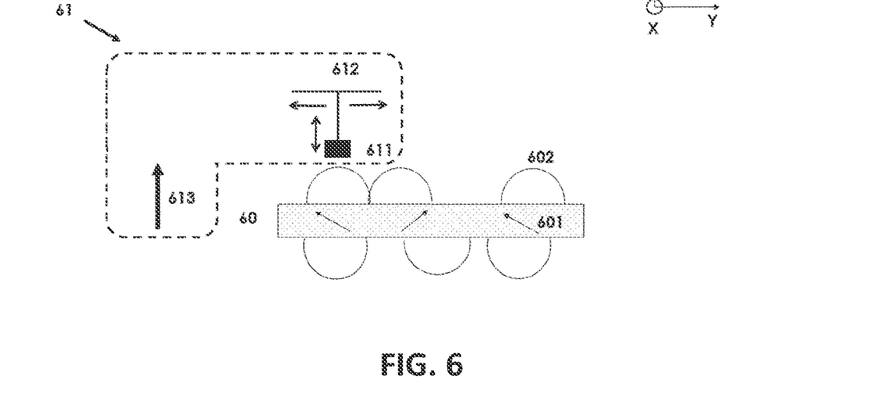
FIG. 6 shows a mapping system 61 according to the invention.

FIG. 6 shows a mapping system 61 according to the invention.

A magnetic sensor 611 comprising at least one stack 1 mounted on a system for scanning 612 along X, Y and Z is displaced above a magnetic sample 60 subjected to a magnetic field 613. The magnetisation induced in the material 601 by the magnetic field 613 creates leakage fields 602 which are measured by the sensor 611. The displacement of the sensor 611 along the axes X, Y and Z makes it possible to carry out mappings of the leakage fields.

In FIG. 6, when the magnetic sample 60 is subjected to a static and/or dynamic magnetic field 613, an induced magnetisation 601 is created at the same frequency as the static and/or dynamic magnetic field 613 in the sample 60. This induced magnetisation 601 creates leakage fields 602 on the exterior of the material of the sample 60 due to dipolar energy, which are going to be measured by the magnetic sensor 611. The sensor 611 is mounted on a system for scanning 612 along X, Y and Z to enable its displacement and/or the displacement of the sample 60 in order to carry out mappings of the leakage fields 602. The sample 60 may have a flat surface or be of other type. It is necessary to know the position of the sensor 611 compared to the surface of the sample 60 in order to interpret the measurements and the mappings made.

The scanning system 612 of the mapping system 61 according to the invention enables a displacement but also a control of the sensor-surface distance. It may be carried out in any manner, but must not create a magnetic field on the sample in order not to perturb the measurement or instead this effect may be compensated. For example, millimetric electric motors or piezoelectric supports for a more precise displacement may be used, or a combination of several systems in order to obtain the widest scanning width with the best precision. Scanning probe microscope type systems may also be used in which the displacement is carried out with piezoelectric supports. The sensor 611 may be positioned at the end of a flexible lever arm of AFM (Atomic Force Microscope) type. The sample-sensor distance is measured and controlled optically thanks to the deflection of the lever arm. The sizes of the mappings can vary typically between 10 μm for piezoelectric supports up to several centimetres with motors.

The detection surface of the sensor 611 as well as the material-sensor distance will give the lateral resolution of the technique. The lateral resolution can typically vary between 100 μm and 500 μm. The sensor 611, using the scanning system 612, must scan the surface of the sample 60 preferably at constant height in order to map the distribution of the magnetisation or magnetic susceptibility of the sample 60.

The sensor 611 must be able to operate with the applied magnetic field 613 and not be saturated for example and must be able to measure the leakage field 602 induced by the sample 60. The maximum applicable field may depend on the direction of the applied magnetic field 613 with respect to the sensitivity axis of the sensor. A reference measurement must be carried out in order to subtract the signal without sample.

The sensor 611 is a magnetoresistive sensor comprising at least one stack 1 according to the invention of TMR or GMR type. The stack 1 according to the invention is particularly interesting because, when it is of GMR or TMR type and comprised in a GMR or TMR sensor as described for example respectively in a first embodiment or in a second embodiment and as represented respectively in FIGS. 3a and 4, it has a field response centred around 0 field, non-hysteretic and linear. One advantage of the stack 1 according to the invention comprised in a GMR or TMR sensor is that it makes it possible to measure signals over a frequency range up to one hundred or so MHz and without inducing magnetic perturbations on the sample.

The sample 60 may be measured under different temperature conditions, for example very low temperature of 10 mK to 450 K, pressure conditions, for example under vacuum or atmospheric pressure, for example under liquid for measurements of biological samples.

Figure 7:
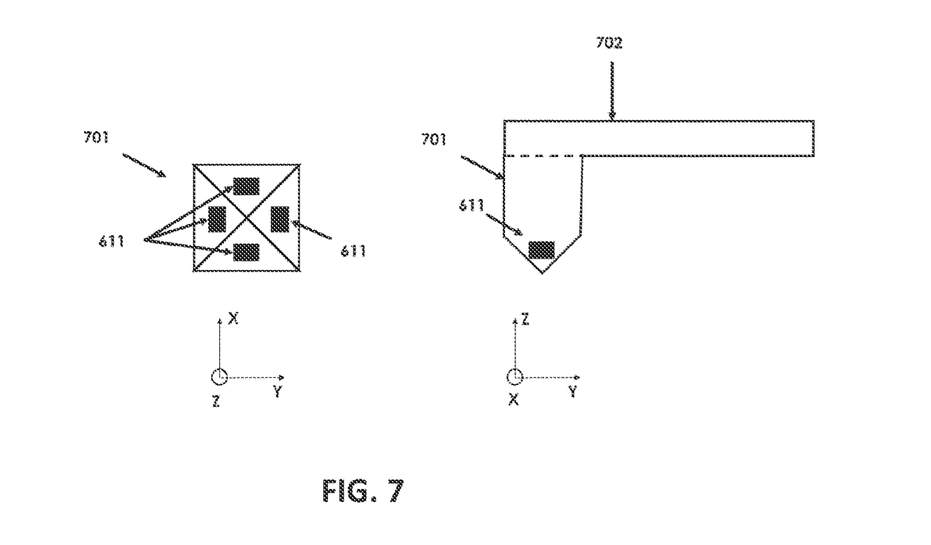
FIG. 7 shows two possible configurations of magnetic sensor 611 scanning the surface of the samples.

FIG. 7 shows two possible configurations of magnetic sensor 611 scanning the surface of samples.

For unidirectional sensors such as GMR and TMR sensors, the use of 3 sensors having orthogonal sensitivity directions may enable a measurement of the leakage fields 602 in the 3 directions of space. Another possibility is to position the TMR or GMR sensors each comprising at least one stack 1 according to the invention of TMR or GMR type on the faces of a tetrahedron shaped support 701 in order to orient the sensors for example at 45° in the direction Z and at 90° in the plane XY. The magnetic sensor 701 composed of several sensors 611 on the 4 faces of a pyramid or on the 3 faces of a tetrahedron in order to access and to reconstruct the different components of the leakage fields 602 emitted by the sample 60 is represented schematically in FIG. 7. The tetrahedron, respectively the pyramid, having four faces, respectively five faces, the remaining face (free that is to say without magnetoresistive stack) of the support is fixed to the cantilever. The measurement of the signals coming from these 4 TMR or GMR sensors each comprising at least one stack 1 according to the invention makes it possible to reconstruct the 3 components of the leakage fields 602 along X, Y and Z. In the same way, stacks 1 of TMR or GMR type may be deposited on a flexible substrate which may be wound in a cone shape (not represented) for example in order to access the different components of the magnetic field by reconstruction. The tetrahedral tip like the cone may be placed at the end of a flexible lever arm 702 of AFM type, as represented in FIG. 7 for the tetrahedral support 701.

Another possibility is the use of networks of sensors 611 which may make it possible to cover a larger surface and thus to carry out mappings more quickly or to measure larger samples.

The substrate or support on which the sensor 611 is manufactured, or deposited for example in the case of GMRs and TMRs, must be insulating or instead must be composed of a material that does not respond to magnetic fields. The substrates typically used are silicon or sapphire. This substrate, a necessary element of the sensor 611 for its manufacture but not necessary for its function of transducer, must not create a parasitic response following the application of the magnetic field 613.

The control and the determination of the height of the sensor 611 compared to the surface of the sample 60 are determining criteria for the reconstruction of the induced magnetisation 601 from the measured signal. Knowledge of the sensitivity of the sensor 611 as a function of the detected magnetic field is also necessary for quantitative reconstruction.

Figure 8A:
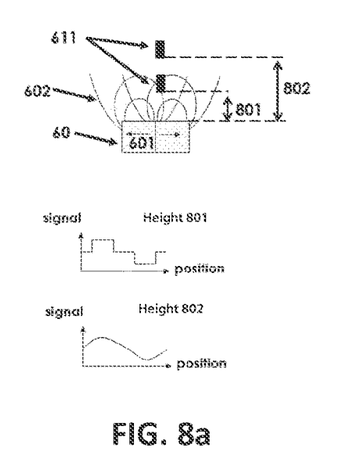
FIG. 8a shows a schematic representation of different sample-sensor distances and the signal detected.

FIG. 8a shows a schematic representation of different sample-sensor distances and the signal detected.

In FIG. 8a is represented one of the two main elements controlling the lateral resolution of the mapping: the sample-sensor distances. The lateral resolution of the mapping of the leakage fields 602, as shown in FIG. 8a, depends on the distance between the sample 60 and the sensor 611. Two different distances 801 and 802 are represented. The leakage fields 602 created by the magnetisation 601 in the sample 60 decrease inversely to the sample-sensor distance cubed.

The sample-sensor distance must be lower than the size of the magnetic elements to discern. An exemplary signal is shown in FIG. 8a as a function of the lateral position of the sensor 611 for the height 801. A loss of information is otherwise obtained when the sample-sensor distance is too great as shown in FIG. 8a for the height 802 on the diagram showing the magnetic signal measured by the sensor 611 as a function of the lateral position. A convolution between the leakage field 602 emitted by the different magnetic objects is then measured by the sensor 611.

A similar effect is observed with the lateral size of the sensor 611.

Figure 8B:
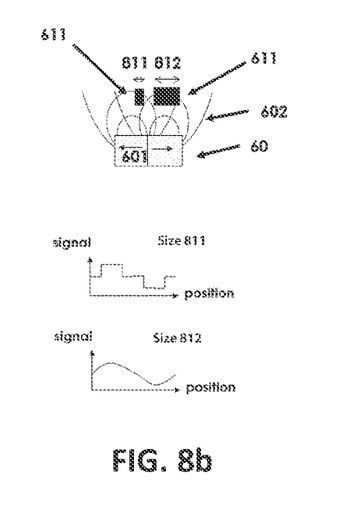
FIG. 8b shows a schematic representation of different sizes of sensor and the signal detected.

FIG. 8b shows a schematic representation of different sizes of sensor and the signal detected.

In FIG. 8b is represented the other of the two main elements controlling the lateral resolution of the mapping: the size of the sensor. The lateral resolution of the mapping of the leakage fields 602, as shown in FIG. 8b, depends on the size of the sensor 611. Two different sizes 811 and 812 are represented.

The sensor 611 realises an average of the values of the leakage field 602 over its entire surface, which implies a reduction in the lateral resolution with an increase in the width of the sensitive zone of the sensor 611 as indicated in FIG. 8b with the sizes 811 and 812 of sensors and the magnetic signals measured as a function of the lateral position on the sample. A loss of information is obtained when the size of the sensor is too big as shown in FIG. 8a for the size 812 in the diagram showing the magnetic signal measured by the sensor 611 as a function of the lateral position.

Figure 9:
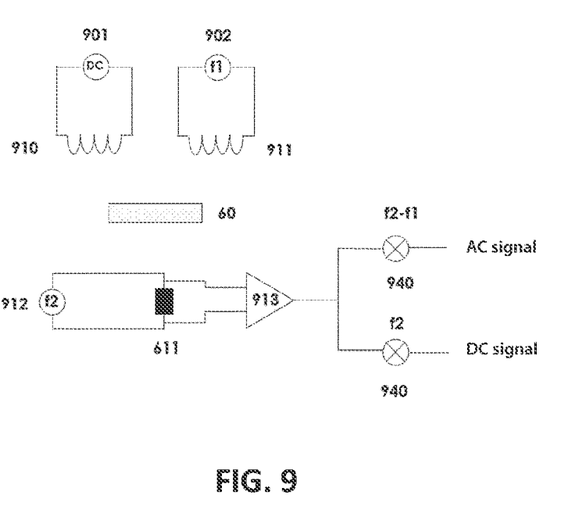
FIG. 9 shows the electrical diagram of the leakage field measurement of the sample subjected to a magnetic field by the sensor of the magnetic mapping system according to the invention.

FIG. 9 shows the electrical diagram of the measurement of leakage field of the sample subjected to a magnetic field by the sensor of the magnetic mapping system according to the invention.

FIG. 9 describes the electrical diagram of the measurement of leakage field 602 emitted continuously by the sample 60 subjected to a static magnetic field 901 created by a current source 910 in a coil. This static magnetic field 901 may also be created in another way by a current source 910. The sample 60 may be simultaneously subjected to a second magnetic field 902, this alternating at the frequency f1 and created by a current source 911 at the frequency f1. The sensor 611 is supplied with a current or voltage source 912 at the frequency f2, the output signal is next amplified by a low noise amplifier 913. Next, a demodulation of the amplified signal is carried out by a demodulator 940 playing the role of lock-in. The demodulation frequency makes it possible to differentiate the AC signal and the DC signal. The signal demodulated at the frequency f2 corresponds to the continuous signal emitted by the sample 60 subjected to the static field 901. The signal demodulated at the frequency f2-f1 corresponds to the alternating signal emitted by the sample 60 following the application of the field AC 902 at the frequency f1. The response of the material 60 to the application of a static and dynamic field may thus be measured simultaneously.

A first embodiment is to use 4 GMR sensors positioned on 4 faces of a pyramid (or 3 sensors on a tetrahedron) as represented in FIG. 7, in order to access and to reconstruct the different components of the leakage fields emitted by the sample. Each sensor 611 is positioned at 45° from the direction Z, 2 sensors 611 are parallel to the axis X and 2 sensors are aligned with the axis Y. The GMR sensors 611 have a linear response between 5 and −5 mT, non-hysteretic and centred around 0 magnetic field that has been obtained thanks to the stack 1 of magnetic layers composing the GMR sensor as represented in FIG. 3. The typical sensitivity is 5 nT/√Hz to 1 Hz. The GMR sensors 611 are of micrometric sizes, typically 3 µm by 10 µm and are for example positioned at 10 µm from the tip of the pyramid or the tetrahedron. On these dimensions are going to depend the lateral resolution which, in this case, will be of the order of 3 to 10 µm. This pyramid 701 is positioned on the scanning system 612 of which the movement along X, Y and Z is made possible for example by the presence of motors. This system 612 thus enables the scanning of the tip on the sample to measure which in this case is planar and aligned in the plane X, Y. The scanning system 612 also enables the control of the height between the sensors 611 and the sample 60 and which must be the smallest possible. This alignment must be carried out by eye. Typically, in this case, 30 µm minimum between the sensor 611 and the sample 60 may be reached, which limits the lateral resolution to 30 µm. The studied sample 60 may for example be a mild steel strip containing grains of different crystallography and having a diameter of the order of ten or so micrometres (µm). A magnetic field 613 comprised between −1 mT and +1 mT is applied in the direction Z for example using Helmholtz coils sufficiently large to be positioned around the sample 60 and sensors 611 and enable the application of a homogeneous field on the sample 60. The sensor 611 is supplied by a current source of 1 mA at 30 Hz. The output signal is next amplified by a low noise amplifier 913 of INA103 type. Next, a demodulation of the amplified signal is carried out by the demodulator 940 by lock-in at the frequency 30 Hz. The applied field 613 induces a magnetisation 601 in the sample 60 which then creates a leakage field 602 measured by the sensor 611. The measurement is then carried out for static fields 901 of 10 Oe to −10Oe by steps of 1Oe in order to reconstruct the hysteresis cycle 50 of the sample 60. A measurement of this hysteresis cycle 50 at each position X, Y with a step lower than 30 µm of the sample makes it possible to carry out a mapping of the magnetic behaviour of the sample 60 for example of steel. Grains of different crystallographies are going to have different hysteresis cycles 50 thus making it possible to identify the crystallography of the grains, their size and their position on the sample 60 with a resolution of 30 µm.

A second embodiment is to integrate a TMR sensor 611 at the end of a flexible lever arm 702 of AFM type. This integration could be done by specific micromanufacturing steps. These micromanufacturing steps require the use of specific wafers, for example a wafer of Si covered by a 1 µm layer of Si3N4. These micromanufacturing steps combine a first etching by RIE (Reactive Ion Etching) of the Si3N4 in order to create etching windows of the Si by KOH chemical etching under the tips. The freeing of the tips is done by RIE on the front face using an aluminium mask which may be easily removed at the end of the method with a basic solution. Two other examples of steps of manufacturing a flexible lever arm may be found in the references (Takezaki et al., Japanese Journal of Applied Physics Vol. 45, No. 3B, 2006, pp. 2251-2254, Costa et al., IEEE Trans. Magn. 2015, 51, 1-4). The TMR sensor has a linear response between 0.5 and −0.5 mT, non-hysteretic and centred around 0 magnetic field that has been obtained thanks to the stack 1 of magnetic layers composing the TMR sensor as represented in FIG. 4. The typical detectivity is 1 nTkHz to 1 Hz and 5$p$TR/Hz to 100 kHz. TMRs have much greater sensitivity than GMRs but also much higher noise. TMR sensors are thus interesting at high frequency and for reduction in size. The TMR is micro-manufactured in pillar shape of 100 nm diameter and is positioned at 100 nm from the end of the tip of flexible lever arm 702. On these dimensions are going to depend the lateral resolution which in this case will be of the order of 100 nm. This lever arm is inserted sensor downwards in an AFM type microscope, in which an optical detection of the deflection of the lever arm enables a control/measurement of the height between sensor 611 and sample 60. A topography of the surface and the surface roughness of the sample 60 is thus possible. This measurement of the height is independent and simultaneous with the magnetic measurement, unlike MFM. In this case, the sensor 611 on the lever arm is fixed and the sample is displaced. The movement of the sample 60 is enabled by the scanning system 612 for example thanks to piezoelectric tubes enabling a nanometric control of the position of the sample 60 with respect to the TMR sensor 611. The end of the lever arm is in contact with the surface of the sample 60 but the lever arm forms an angle of 20° with respect to the surface of the sample 60. The sample-sensor distance is thus 100 nm×sin(20)=34 nm. The lateral resolution is thus limited by the size of the sensor 611 which is 100 nm. The studied sample 60 is for example a thin film composed of a checkerboard of 2 materials. The sample 60 is for example a steel strip having undergone a heat treatment. It is possible that certain parts composing the strip have not evolved in a manner conforming to the heat treatment due to defects in the material composing the sample 60. The size of these parts or grains is of the order of one hundred or so nanometres. The remainder of the strip is uniform. The two phases thus have a different crystallography and thus a different magnetic susceptibility. A dynamic magnetic field of 0.1 mT at frequency f1 of 100 kHz is applied in the direction Z for example using Helmholtz coils sufficiently large to be positioned around the sample 60 and sensors 611 and to enable the application of a homogeneous field on the sample 60. The sensor 611 is supplied by a 1 mA current source at a frequency f2 of 30 kHz. The output signal is next amplified by a low noise amplifier 913 of INA103 type. Next, a demodulation of the amplified signal is carried out by the demodulator 940 by lock-in at the frequency f2−f1=100 kHz−30 kHz=70 kHz. The alternating signal emitted by the sample 60 following the application of the AC field 902 is thus obtained. A measurement of this signal at each position X, Y with a step less than 100 nm of the sample 60 makes it possible to carry out a mapping of the magnetic susceptibility of the sample 60. Homogeneous magnetic susceptibility zones will appear on the mappings and will make it possible to locate and identify different microstructure grains.

It will be obvious to those skilled in the art that the invention is not limited to the embodiments and to the applications described previously.

The invention claimed is:
1. A magnetoresistive stack comprising:
   a reference layer comprising:
      a first magnetic layer,
      a first antiferromagnetic layer in exchange coupling with the first magnetic layer, a second magnetic layer substantially of the same magnetisation as the first magnetic layer, a first non-magnetic spacer layer between the first magnetic layer and the second magnetic layer with a thickness enabling an antiferromagnetic RKKY coupling between the first magnetic layer and the second magnetic layer, said antiferromagnetic RKKY coupling having a first coupling intensity, a free layer having a coercivity lower than 10 microTesla, the free layer comprising:

a third magnetic layer, a second antiferromagnetic layer in exchange coupling with the third magnetic layer, a fourth magnetic layer substantially of the same magnetisation as the third magnetic layer, a second non-magnetic spacer layer between the third magnetic layer and the fourth magnetic layer with a thickness enabling an antiferromagnetic RKKY coupling between the third magnetic layer and the fourth magnetic layer, said antiferromagnetic RKKY coupling having a second coupling intensity lower than the first coupling intensity, and a third non-magnetic spacer layer separating the reference layer and the free layer.

2. The magnetoresistive stack according to claim 1, wherein the magnetoresistive stack is a giant magnetoresistance.

3. The magnetoresistive stack according to claim 1, wherein the third non-magnetic spacer layer is a tunnel barrier and wherein the magnetoresistive stack is a magnetoresistance tunnel.

4. A magnetoresistive sensor comprising at least one magnetoresistive stack according to claim 1.

5. The magnetoresistive sensor according to claim 4, comprising a tetrahedral shaped support, and three magnetoresistive stacks and wherein the three magnetoresistive stacks are each arranged on a different face of the tetrahedral shaped support.

6. The magnetoresistive sensor according to claim 5, comprising a flexible lever arm, said lever arm comprising at its end the tetrahedral, respectively pyramidal, shaped support comprising said magnetoresistive stacks.

7. The magnetoresistive sensor according to claim 4, comprising a pyramidal shaped support, and four magnetoresistive stacks and wherein the four magnetoresistive stacks are each arranged on a different face of the pyramidal shaped support.

8. A system for magnetically mapping at least one magnetic sample, the system comprising at least one magnetoresistive sensor according to claim 4 for detecting the leakage fields emitted by the magnetic sample, a scanning system and a first current source configured to create a first magnetic field applied to the magnetic sample.

9. A magnetic mapping system according to claim 8, wherein the first magnetic field created by the first current source is a static magnetic field, wherein the magnetic mapping system comprises a second current source configured to create a dynamic magnetic field applied to the magnetic sample.

10. The magnetic mapping system according to claim 9, wherein:

the dynamic magnetic field is created at a first frequency, the magnetoresistive sensor is supplied at a second frequency, each signal captured by the magnetoresistive sensor comprises:

a first continuous signal emitted by the sample subjected to the static magnetic field and a second alternating signal emitted by the sample subjected to the dynamic magnetic field, each signal captured by the magnetoresistive sensor is demodulated at the second frequency to recover the first continuous signal emitted by the sample subjected to the static magnetic field and each signal captured by the magnetoresistive sensor is demodulated at the frequency corresponding to a subtraction of the first frequency from the second frequency to recover the second alternating signal emitted by the sample subjected to the dynamic magnetic field.

* * * * *